United States Patent
Hansen et al.

(10) Patent No.: US 6,489,913 B1
(45) Date of Patent: Dec. 3, 2002

(54) SUB-RANGING ANALOG-TO-DIGITAL CONVERTER USING A SIGMA DELTA CONVERTER

(75) Inventors: Victor Lee Hansen; Charles L. Saxe, both of Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/962,285

(22) Filed: Sep. 24, 2001

(51) Int. Cl.[7] ............................. H03M 1/14; H03M 3/00
(52) U.S. Cl. ......................................... 341/156; 341/143
(58) Field of Search ................................. 341/143, 155, 341/156

(56) References Cited

U.S. PATENT DOCUMENTS

| | | |
|---|---|---|
| 3,993,890 A | 11/1976 | Peled et al. |
| 4,612,533 A | 9/1986 | Evans |
| 4,996,530 A | 2/1991 | Hilton |
| 5,936,562 A * | 8/1999 | Brooks et al. ............... 341/143 |
| 5,982,313 A * | 11/1999 | Brooks et al. ............... 341/143 |
| 6,202,074 B1 | 3/2001 | Lipka |
| 6,313,775 B1 * | 11/2001 | Lindfors et al. ............ 341/143 |
| 2002/0039077 A1 * | 4/2002 | Lyden ......................... 341/143 |

OTHER PUBLICATIONS

Ping Wah Wong, "Fir Digital Filters with Sigma–Delta Modulated Inputs and Their Implementation", Clarkson University, Potsdam, NY, 1990 IEEE.

Colin Kuskie, Bo Zhang, Richard Schreier, "A Decimation Filter Architecture for GHz Delta–Sigma Modulators", Oregon State University, Corvallis, Oregon, 1995 IEEE.

Prabir C. Maulik, Mandeep S. Chadha, Wai L. Lee, Philip J. Crawley "A 16–Bit 250–kHz Delta–Sigma Modulator and Decimation Filter", IEEE Journal of Solid–State Circuits, vol. 35, No. 4, Apr. 2000.

* cited by examiner

Primary Examiner—Howard L. Williams
(74) Attorney, Agent, or Firm—Francis I. Gray

(57) ABSTRACT

An improved sub-range ADC uses a sigma delta converter which eliminates both the sample and hold and digital-to-analog converter circuits of prior sub-ranging ADCs. An input analog signal is applied to a sigma delta modulator that provides a one-bit output. The one-bit output is input to a first analog filter and a digital correction circuit. The output from the first analog filter and the input analog signal, suitably delayed and optionally filtered, are input to a difference amplifier that provides the input to an ADC. The output of the ADC also is input to the digital correction circuit. The digital correction circuit includes a digital decimation filter for the one-bit sigma delta modulator output to produce a multi-bit digital output that is added to, the output from the ADC. The resulting digital signal may be additionally digitally filtered to produce a converted digital signal that corresponds to the input analog signal.

22 Claims, 5 Drawing Sheets

SUB-RANGING ANALOG-TO-DIGITAL CONVERTER USING A SIGMA DELTA CONVERTER

BACKGROUND OF THE INVENTION

The present invention relates to analog-to-digital converters, and more particularly to an analog-to-digital converter (ADC) using a sigma delta converter that fits into a class of converters known as sub-ranging ADCs.

A type of ADC known as a sub-ranging ADC has two converters and a digital-to-analog converter (DAC) to improve on the characteristics of a single monolithic converter. A typical architecture is shown in FIG. 1 where an analog signal is input to a sample and hold circuit. The output from the sample and hold circuit is input to a first monolithic ADC and to a difference amplifier. The output from the first ADC is input to a digital correction circuit and to a DAC. The output from the DAC is input to the difference amplifier, with the difference output being input to a second monolithic ADC. The output from the second ADC also is input to the digital correction circuit. The digital correction circuit typically has a random access memory (RAM) that is addressed by the output from the first ADC to provide an output that is added to the output from the second ADC to produce a converted digital signal corresponding to the input analog signal.

The performance of this architecture is primarily limited by two devices the sample and hold circuit and the DAC. A major part of the performance depends on the characterization of the DAC. DC quantization levels are easily corrected, but AC non-linearities are very difficult to correct, if done at all.

What is desired is a more accurate sub-ranging ADC that eliminates the requirement for correcting AC non-linearities.

BRIEF SUMMARY OF THE INVENTION

Accordingly the present invention provides a sub-ranging analog-to-digital converter (ADC) using a sigma delta converter which eliminates both the sample and hold and digital-to-analog converter circuits of prior sub-ranging ADCs. An input analog signal is applied to a sigma delta modulator that provides a one-it output. The one-bit output is input to a first analog filter and a digital correction circuit. The output from the first analog filter and the input analog signal, suitably delayed and optionally filtered, are input to a difference amplifier that provides the input to an ADC. The output of the ADC also is input to the digital correction circuit. The digital correction circuit includes a digital decimation filter for the one-bit sigma delta modulator output to produce a multi-bit digital output that is added to the output from the ADC. The resulting summed digital signal may be additionally digitally filtered to produce a converted digital signal that corresponds to the input analog signal.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 2A is a block diagram view of a portion of the sigma delta converter according to the present invention.

DETAILED DESCRIPTION OF THE INVENTION

Figure 1:
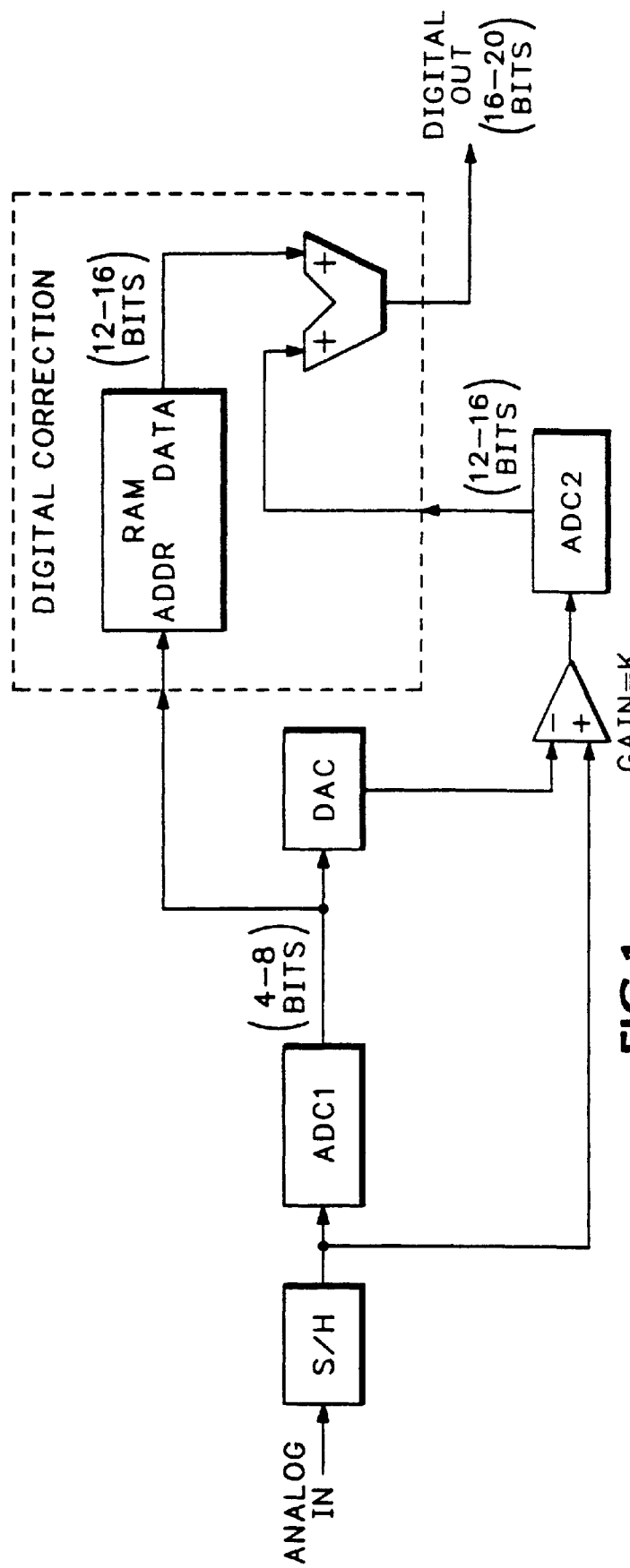
FIG. 1 is a block diagram view of a sub-ranging ADC according to the prior art.
Figure 2:
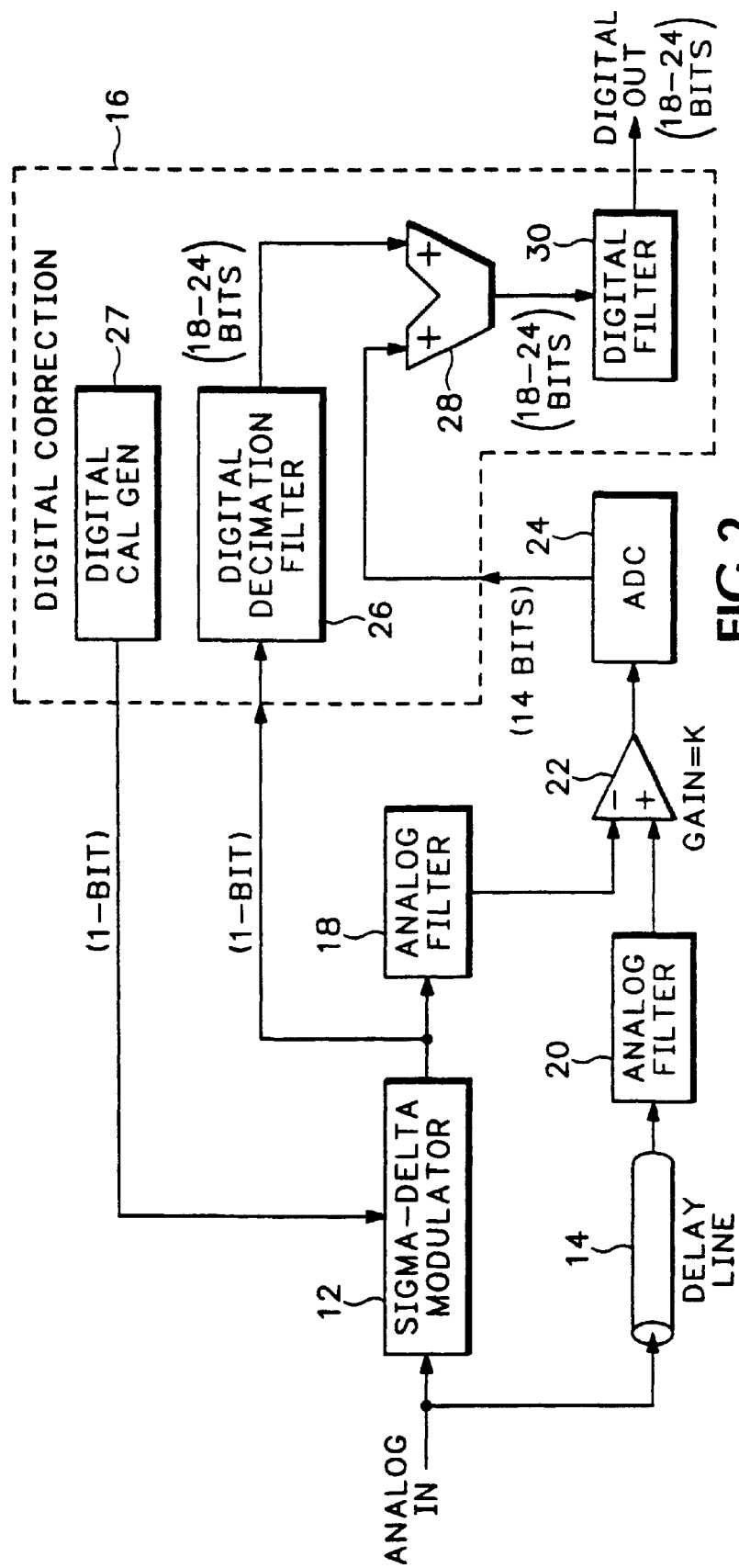
FIG. 2 is a block diagram view of a sub-ranging ADC using a sigma delta converter according to the present invention.

Referring now to FIG. 2 an analog signal is input to a sigma delta modulator 12 and a delay line 14. The sigma delta modulator 12 provides a one-bit output to a digital correction circuit 16 and to a first analog filter 18. The output from the delay line 14 is input to an optional second analog filter 20. The outputs from the analog filters 18, 20 are input to a difference amplifier 22. The difference signal from the difference amplifier is input to an analog-to-digital converter (ADC) 24. The output of the ADC 24 also is input to the digital correction circuit 16. The digital correction circuit 16 includes a digital decimation filter 26 to which the one-bit signal from the sigma delta modulator 12 is input. The output of the digital decimation 26 is input to an accumulator 28 together with the output from the ADC 24. The output from the accumulator 28 is input to a second digital filter 30, the output of which is a converted digital signal.

The sigma delta modulator 12 may be thought of as a one-bit ADC that has a noise shaping property. The analog output of the sigma delta modulator 12 is driven from −V to +V volts, −1 and +1 being used for clarity. This keeps AC signals centered around ground potential. The sigma delta modulator 12 over-samples the analog signal, such as at 2 Gs/s. This allows for high granularity at a system bandwidth, such as 50 MHz, and a required number of bits. The first analog filter 18 may be an RLC passive filter that reduces the bandwidth by 3–4 octaves. Given a noise shaping of a second order modulator or higher, this is sufficient for at least seven effective bits of signal resolution. The high conversion rate and the nature of the circuit reproduces the analog signal to seven bits or so with additive random noise.

In the other path the delayed analog signal is put through the second analog filter 20, which is similar to the first analog filter 18. This second filter 20 is optional and may be eliminated in some cases. The second filter 20 is included so both paths have. matched passband and step response effects. The delay of the delay line 14 is adjusted so both paths of the signal arrive at the difference amplifier 22 at nearly the same time. The signals are required to be close enough to each other in amplitude so that after amplification by a gain factor K the signal remains in the voltage range of the amplifier 22 and the ADC 24. One specification for amplifiers is "Recovery from Overdrive". Overdrive is when an amplifier is driven out of it's linear range by too large a signal. A typical amplifier suitable for this application has recovery times many times longer than the sample rate of the ADC 24 for the type of accuracy desired. So this circuit is designed to keep the amplifier 22 from ever being overdriven. The sigma delta modulator 12.is much faster than the output sampling rate and has a relatively small time delay. This keeps the signals matched at the amplifier 22 and keeps the delay time small. The delay line 14 may be implemented by a few feet of coaxial cable.

The same one-bit signal that is provided to the first analog filter 18 is provided to the digital correction circuit 16. The decimation digital filter 26, described in greater detail below, is designed to match the frequency response (magnitude and phase) of the first analog filter 18 to a very high degree. This digital filter 26 may have up to a thousand coefficients, and the required matching may be one part in 100,000. Feasibility of this filter has been demonstrated with approximately 400 coefficients in a finite impulse response (FIR) filter. The preferred implementation is with a FIR filter for ease of design, but an infinite impulse response (IIR) filter may be substituted. Although it is very common for FIR filters to be designed to be linear in phase, the digital filter 26 in this case requires a non-linear response to match the analog response of the first analog filter 18.

The input to the digital decimation filter 26 is at a high frequency, such as 2 Ghz, while the output rate is the same as the ADC 24, such as 100 MHz. The digital filter 26 is designed such that only samples at the output rate are produced and are in time alignment with the samples produced by the ADC 24. The decimation reduces the required number of computations per input sample for this example by a factor of twenty. Since the input is only one bit, either a 0 or a 1, multiplies required in a FIR implementation may be replaced with a simpler data selection process function. Internal precision of the digital filter 26 may be 20 bits or so. Even though the input has no more than seven effective bits, the resolution may be made 20 bits or more for matching the first analog filter 18. The output of the digital decimation filter 26 is added to the output of the ADC 24 with appropriate scaling. The input of the ADC 24 is K times larger by the gain provided by the amplifier 22. This results in the output of the ADC 24 having a scale factor of K with respect to the output of the digital decimation filter 26. The analog filters 18, 20 and the gain amplifier 22 may introduce some droop in the passband. To correct for this the second digital filter 30 may be included to compensate for passband flatness.

Any distortion and noise that the ADC 24 introduces is at the 1/K level. If K=10 and the specified harmonic distortion of the ADC 24 is –75 dB, its distortion in the final output is 1/K times less, or –95 dB. The noise it produces is for the same reason 20 dB lower. The combination of the one-bit signal and the passive RLC filter 18 may be designed to be extremely linear. Because it is linear, it may be characterized to a high degree of accuracy and matched digitally. Once characterized and matched, the input to the analog filter 18 is known exactly, and this signal is filtered digitally. Then when the analog filtered modulator output signal is subtracted from the input signal in the amplifier 22 and then the digitally filtered modulator output is added back by the accumulator 28, the signal is essentially zeroed to the required amount, –100 dB or so. Be cause the signal from the first analog filter 18 is canceled out, the accuracy and distortion levels need only be good enough for cancellation in the difference amplifier 22. The elimination of the sample and hold circuit also improves accuracy since such circuits are difficult to make accurate and linear to the levels desired.

Differences in components may result in a variation of response from the first analog filter 18. The exact. magnitude and phase characteristic of the analog filter 18 is measured as part of a calibration. The calibration may be performed at the factory, or an internal one-bit calibration signal with sigma delta characteristics may be provided to the sigma delta modulator 12 by a digital calibration signal generator 27 internal to the digital correction circuit 16 for field calibration. As shown in FIG. 2A a multiplexer 29 within the sigma delta modulator 12 has as inputs the one-bit calibration signal and the one-bit modulator output signal. The output from the multiplexer 29 is input to an output drive circuit 31 of the sigma delta modulator 12. The frequency response (magnitude and phase) are calculated from the output of the ADC 24.

Figure 3:
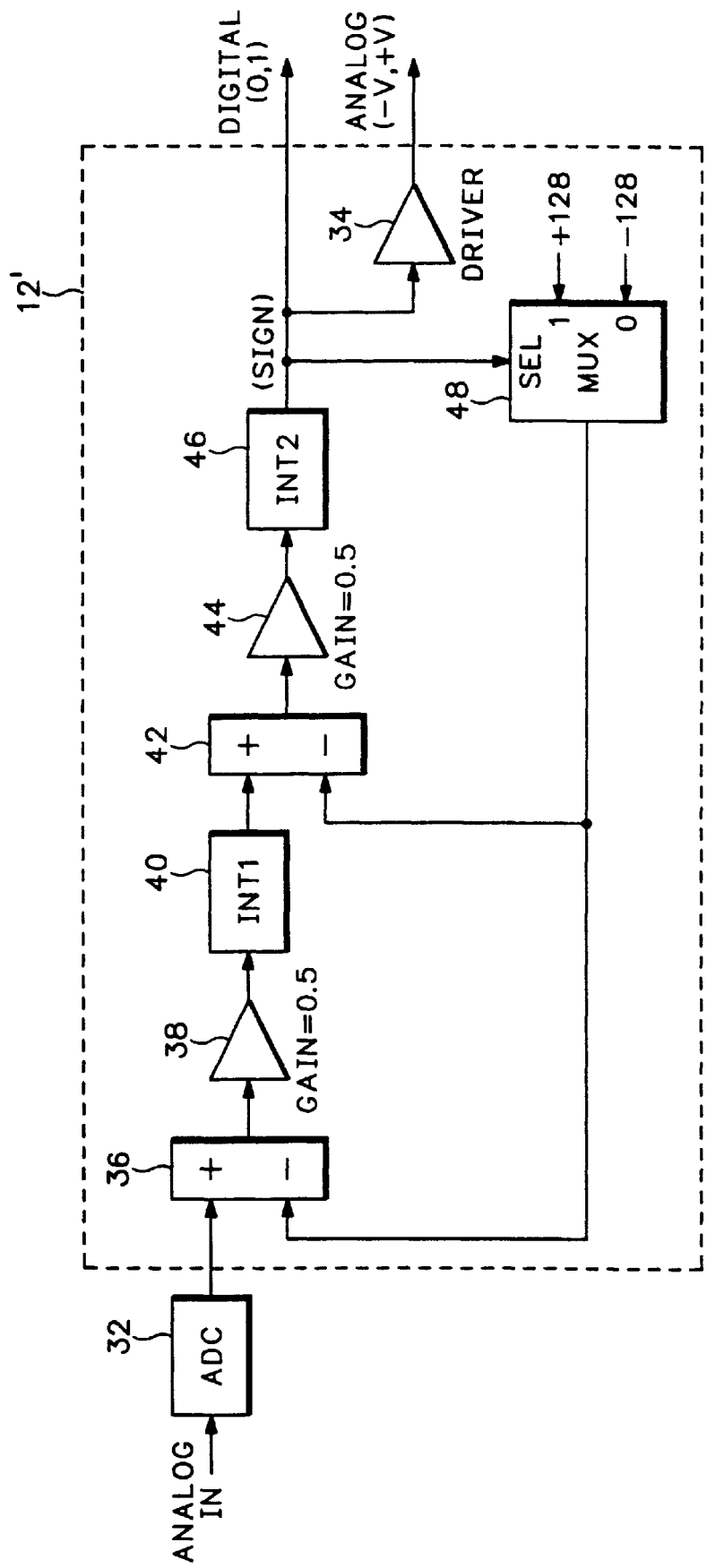
FIG. 3 is a block diagram view of an alternative embodiment of a sigma delta converter for use in a sub-ranging ADC according to the present invention.

An alternative to the sigma delta modulator 12 is shown in FIG. 3. In this embodiment an initial ADC 32 is used to digitize the analog input signal, and the sigma delta modulator 12' is implemented digitally. Again the output is a one-bit signal that may be provided as a digital signal (0,1) or via a driver 34 as an analog signal (–V,+V). The digital sigma delta modulator 12' has an input subtractor 36 with the digitized output from the initial ADC 32 as one input. The output from the input subtractor 36 is input to a first attenuating amplifier 38 and then to a first integrator 40. The output of the first integrator 40 is input to a second subtractor 42 followed by a second attenuating amplifier 44 and a second integrator 46. The sign bit of the output from the second integrator 46 is the one-bit output signal that also is used as a select signal for a multiplexer 48 that selects between opposing digital values, such as +128 and –128, having the same bit length as the digitized analog signal. The output from the multiplexer 48 is the second input to the respective subtractors 36, 42. Because the circuit application does not require high linearity in the digital sigma delta modulator 12', and no more bits than seven, this may be substituted for the analog sigma delta modulator 12.

The digital filter 26 is optimized for the one-bit signal provided by the sigma delta modulator 12, 12'. By taking advantage of the fact that the input signal is one bit, and by precomputing sums and differences of adjacent coefficients, the overall size of the digital decimation filter 26 may be reduced. The architecture shown in FIG. 4 may be easily programmed for any decimation rate from 1 to N, where N is a maximum determined by the amount of hardware provided. The precomputed sums and differences are stored in a memory (not shown), which preferably is a random access memory (RAM) for programmability, but may be a read only memory (ROM). The bits of the input data may be joined together to address the memory. For instance to compute $x(0)*h(2)+x(1)*h(1)+x(2)*h(0)$ there are only eight possible output results from coefficient set H(0,1,2) when x=–1,1. For short filters this memory may be made very big to allow the complete filter to be computed by addressing the contents of a ROM or equivalent RAM. When a FIR filter is producing points at. less than the input rate, i.e., decimating, it is standard practice to only compute the output points not being thrown away.

For the present implementation the digital filter 26 is designed to run at decimation rates of 20 or 24, but works at any rate from 1–24. This is to accommodate different output rates of 100 MHz or 85 MHz for different applications with a 2 or 2.04 GHz input data rate. The input of the digital filter 26 is the output of the sigma delta modulator 12, 12'. A decimate by 20 rate is used as an example herein. The modulator 12, 12' produces points at a 2 GHz rate, buffers up twenty input points and transfers the points at the 100 MHz rate to the accumulator 28. If the decimation rate is 24, it buffers up 24 points and transfers them at the 85 MHz rate.

Figure 4:
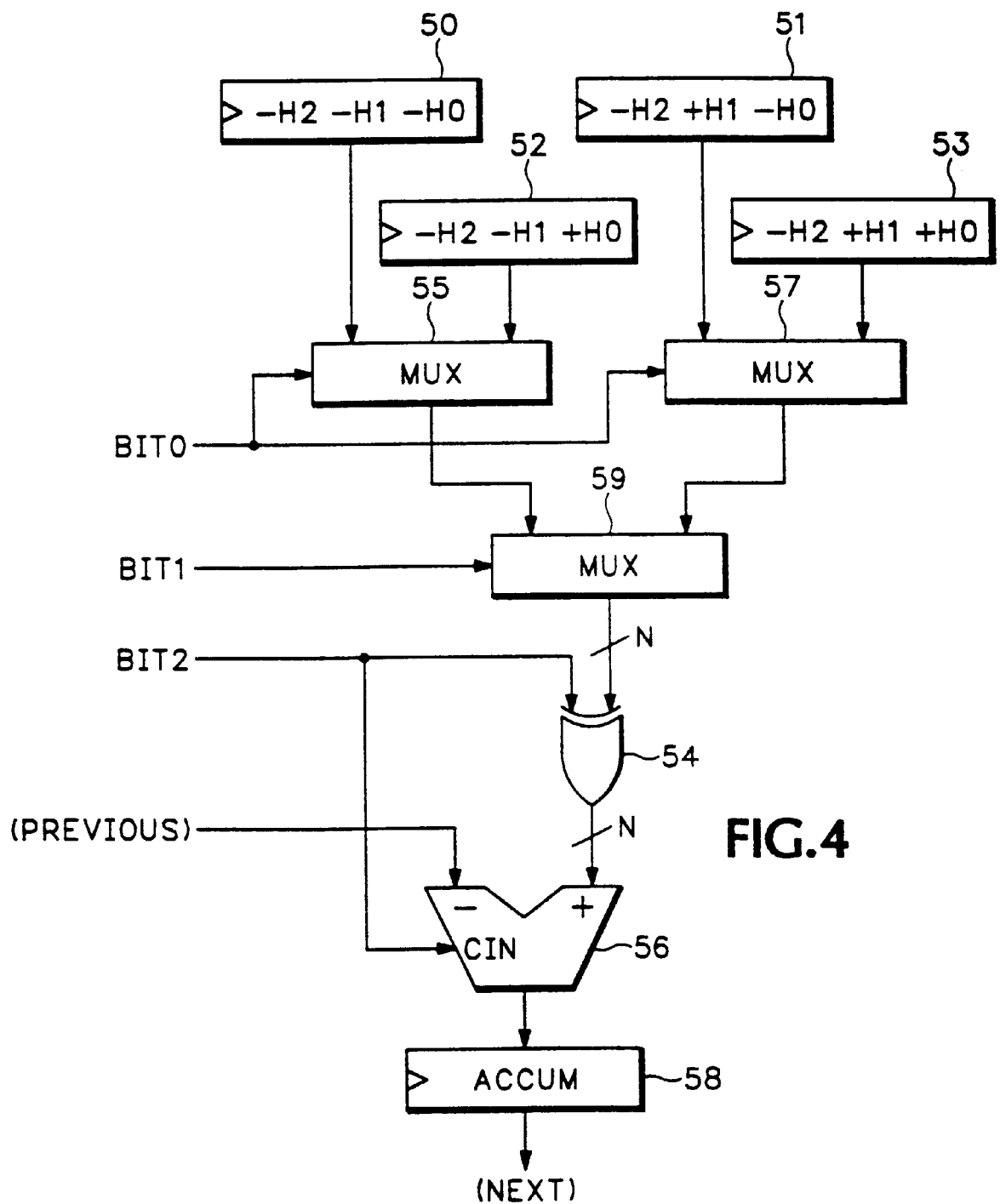
FIG. 4 is a block diagram view of a building block for a sigma delta decimation finite impulse response (FIR) filter for use in a sub-ranging ADC according to the present invention.

The required size of the hardware is reduced by computing three input samples (bits) at a time. FIG. 4 shows a basic FIR computation block 49. Three bit s at a time are determined to result in the smallest size. As more bits are combined, the size ($2^{bits}$) of the table increases more than the reduction of other circuitry. This is especially true when RAM is used than ROM. Three bits at a time may also be implemented in a faster register/multiplexer configuration. As shown four registers 50–53 hold one-half of the possible combinations of three coefficients. The other four combinations may be obtained by negation of the stored values. This is implemented as an exclusive OR gate 54 and by controlling the carry in to an adder 5.6. The values written to the registers 50–53 may be changed to allow for any desired filter configuration. The registers 50–53 are paired so that each pair is input to a separate multiplexer 55, 57 controlled by bit0 of the three-at-a-time bits. The outputs of the first multiplexers 55, 57 are input to a third multiplexer 59 controlled by bit1 of the three-at-a-time bits. The output of the third multiplexer 59 is input to the exclusive OR gate 54 together with bit3 of the three at a time bits. The output of the exclusive OR gate 54 is input to the adder 56 together with the output from a previous stage of the FIR filter, with bit2 controlling the carry in for the adder. The output of the adder 56 is provided to an accumulator 58 that provides the output for input to the adder in a next stage of the FIR filter.

Figure 5:
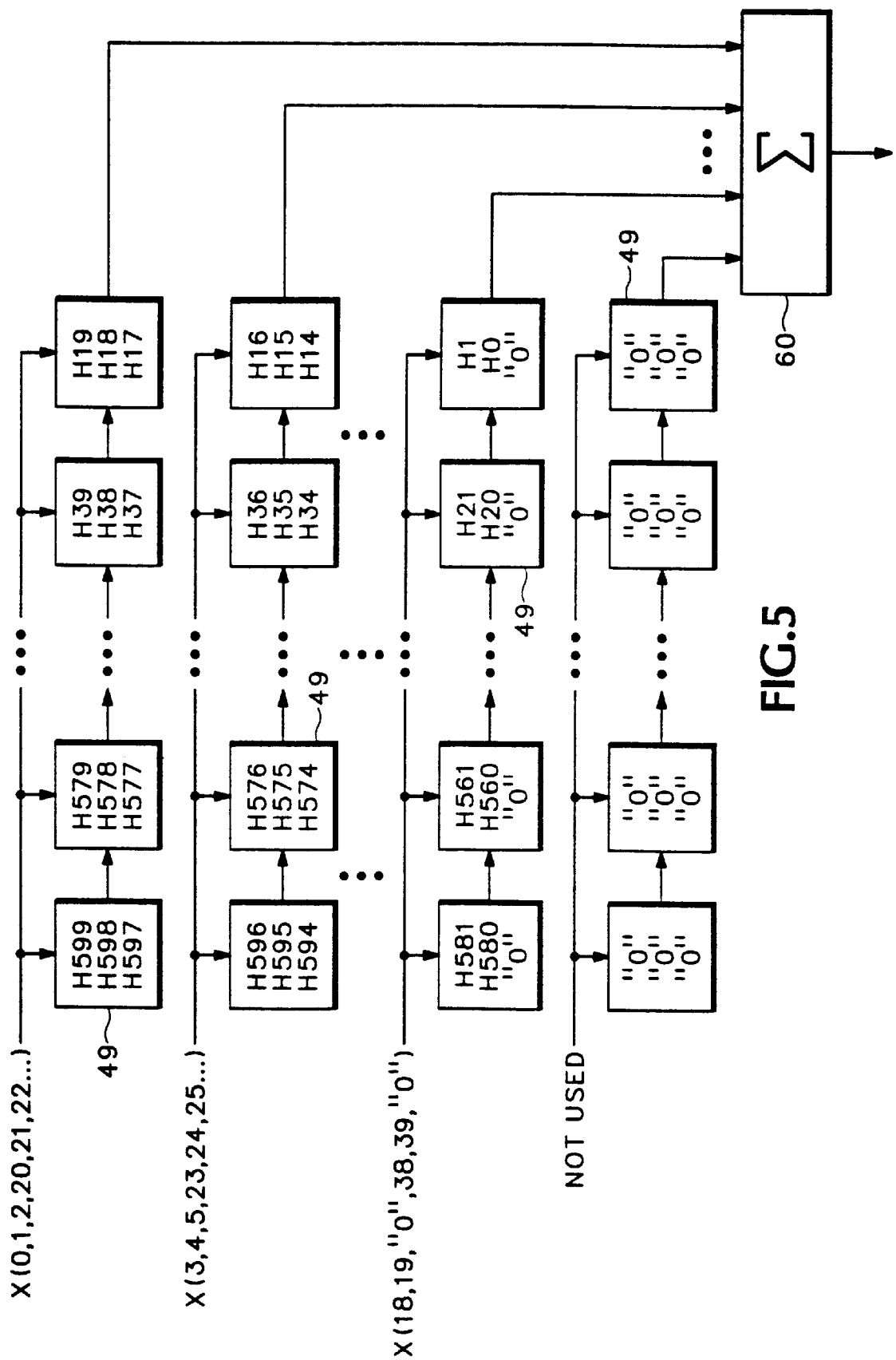
FIG. 5 is a block diagram view of a decimate-by-20 FIR filter for use in a sub-ranging ADC according to the present invention.

FIG. 5 shows the configuration of basic filter blocks 49 connected for a length 600, decimate by 20 filter. A shorter than 600 coefficient filter may be implemented by setting the coefficients not used to "0". The filter in this example is clocked at the 100 MHz output rate, For a 600 coefficient, decimate by 20 filter each input sample operates on 30 coefficients. This is done in a row as shown. Since the filter is running at $\frac{1}{20}$ of the input rate and three input samples are combined, 20/3=7 rows are required. To accommodate decimate by 24 eight rows are-provided. For decimate by 20 the coefficient registers in row 8 are set to "0" and it has no effect on the output points. Each of the eight rows produces part of each point. The final output point is obtained by summing the output of the rows, which may be done with 4+2+1 pipelined-adders 60.

Using the transpose method (clocked at the output sample rate) with the number of filter sections per row equal to the maximum filter size divided by the decimation rate and the number of rows determined by the maximum decimation rate. divided by the number of input points combined for computations allows the filter to be clocked at the slower output rate. Additionally the structure allows for any integer decimation rate to be constructed by the way the registers are loaded with coefficients and by supplying the input points in parallel at the output rate.

Thus the present invention provides a sub-ranging ADC that uses a sigma delta modulator as a first converter to produce a one-bit output for an input analog signal, which one-bit output is filtered and differenced with the input analog signal for application to a monolithic ADC. The one-bit output and the ADC output are applied to a digital correction circuit that uses a digital decimation filter for the one-bit signal to produce a converted digital signal corresponding to the input analog signal.

What is claimed is:

1. An improved sub-ranging analog-to-digital (ADC) converter of the type having a first converter stage with an analog signal to be converted as an input, a difference amplifier with an analog version of the output from the first converter stage and the analog signal to be converted as inputs, a second converter stage with the output from the difference amplifier as an input, and a digital correction circuit with the outputs from the two converter stages as inputs to produce as an output a converted digital signal corresponding to the analog signal to be converted wherein the first converter stage comprises:

a sigma delta modulator having as an input the analog signal to be converted and having as an output a one-bit signal, the output being one of the inputs to the digital correction circuit; and a first analog filter having as an input the one-bit signal and having an output coupled as the analog version for input to the difference amplifier.

2. The improved sub-ranging ADC as recited in claim 1 further comprising a delay line having an input coupled to receive the analog signal and an output coupled as one of the inputs to the difference amplifier, the delay line having a delay such that the analog signal to be converted and the output from the first analog filter arrive at the inputs to the difference amplifier at approximately the same time.

3. The improved sub-ranging ADC as recited in claim 2 further comprising a second analog filter having an input coupled to the output of the delay line and an output coupled as one of the inputs to the difference amplifier, the second analog filter matching passband and step response effects of the first analog filter.

4. The improved sub-ranging ADC as recited in claim 1 wherein the sigma delta modulator comprises:

an input ADC having an input coupled to receive the analog signal to be converted and having an output; and a digital sigma delta modulator having an input coupled to the output of the input ADC and providing the one-bit signal as an output.

5. The improved sub-ranging ADC as recited in claim 4 wherein the digital sigma delta modulator comprises:

a first subtractor having the output of the initial ADC as a first input and having an output;

a first integrator having an input coupled to the output of the first subtractor and having an output;

a second subtractor having the output of the first integrator as a first input and having an output;

a second integrator having an input coupled to the output of the second subtractor and having an output that produces a sign value as the one-bit signal; and a multiplexer having as inputs plus and minus values, having a select input coupled to the output of the second integrator, and having an output coupled to second inputs of each of the first and second subtractors.

6. The improved sub-ranging ADC as recited in claim 5 wherein the digital sigma delta modulator further comprises:

a first attenuation amplifier having an input coupled to the output of the first subtractor and having an output coupled to the input of the first integrator; and a second attenuation amplifier having an input coupled to the output of the second subtractor and having an output coupled to the input of the second integrator.

7. The improved sub-ranging ADC as recited in any of claims 1–6 wherein the digital correction circuit comprises:

a digital decimation filter having as an input the one-bit signal and providing as an output a multi-bit digital signal; and an accumulator having as inputs the output from the second converter and the multi-bit digital signal and having an output coupled to produce the converted digital signal.

8. The improved sub-ranging ADC as recited in claim 7 further comprising an output digital filter for compensating for passband flatness having as an input the output from the accumulator and as an output the converted digital signal.

9. The improved sub-ranging ADC as recited in claim 7 wherein the digital decimation filter comprises:

a plurality of rows of filter blocks, the filter blocks in each row being coupled such that a prior filter block has an output coupled to an input of a next filter block in the row, each filter block in the row having a common input to receive a combination of bits from the one-bit signal and having a number of filter coefficients equal to the number of the combination; and means for summing outputs from a last filter block in each row to produce the multi-bit digital signal.

10. The improved sub-ranging ADC as recited in claim 9 wherein each filter block comprises:

a plurality of coefficient registers equal to $2^{N-1}$, where N is the number of bits in the combination, each. coefficient register containing a combination of N coefficients and having an output;

means for multiplexing the outputs of the coefficient registers as a function of N–1bits of the combination to produce an interim digital signal;

an exclusive OR gate having the Nth bit of the combination and the interim digital signal as inputs and having an output;

a summation circuit for combining the output of the prior filter block with the output of the exclusive OR gate under control of a carryin signal provided by the Nth bit of the combination, the summation circuit having an output coupled to the input of the next filter block.

11. The improved sub-ranging ADC as recited in claim 9 wherein the number of filter blocks in each row equals a maximum filter size divided by a desired decimation rate and the number of rows equals a maximum decimation rate divided by N, where N is the number of bits in the combination.

12. An improved method of converting an analog signal to a digital signal of the type having the steps of firstly converting the analog signal to a first digital signal, differencing an analog version of the first digital signal with the analog signal to produce a differenced signal, secondly converting the differenced signal to a second digital signal, and combining the first and second digital signals to produce the digital signal wherein the firstly converting step comprises the steps of:

sigma delta modulating the analog signal to produce a one-bit signal as the first digital signal; and analog filtering one-bit signal to produce the analog version.

13. The improved method as recited in claim 12 further comprising the step of delaying the analog Signal to produce a delayed analog signal such that the delayed analog signal and the analog version arrive at the differencing step at approximately the same time.

14. The improved method as recited in claim 13 further comprising the step of analog filtering the delayed analog signal prior to input to the differencing step, the delayed analog signal analog filtering step matching passband and step response effects of the one-bit signal analog filtering step.

15. The improved method as recited in claim 12 wherein the sigma delta modulating step comprises the steps of:

converting the analog signal to an initial digital signal; and digital sigma delta modulating the initial digital signal to produce the one-bit signal.

16. The improved method as recited in claim 15 wherein the digital sigma delta modulating step comprises the steps of:

subtracting a feedback digital signal from the initial digital signal to produce a first difference digital signal;

integrating the first difference digital signal to produce a first interpolated digital signal;

subtracting the feedback digital signal from the first interpolated digital signal to produce a second difference digital signal;

integrating the second digital signal to produce a second interpolated digital signal having a sign bit, the sign bit being the one-bit signal; and selecting as a function of the sign bit one of two digital values as the feedback digital signal.

17. The improved method as recited in claim 16 wherein the digital sigma delta modulating step further comprises the steps of:

attenuating the first difference digital signal prior to input to the first integrating step; and attenuating the second difference digital signal prior to input to the second integrating step.

18. The method as recited in any of claims 12–17 wherein the combining means comprises the steps of:

decimation filtering the one-bit signal to produce a multi-bit digital signal; and accumulating the second digital signal with the multi-bit digital signal to produce the digital signal.

19. The method as recited in claim 18 further comprising the step of digitally filtering the output from the accumulating step to produce the digital signal to compensate for passband flatness.

20. The method as recited in claim 18 wherein the decimation filtering step comprises the steps of:

applying the one-bit signal as a combination of bits to each of a plurality of filter blocks coupled in series in each of a plurality of rows of filter blocks, each row receiving a different combination of bits- and each filter block receiving a different set of filter coefficients corresponding to the combination of bits; and summing outputs from a last filter block in each row to produce the multi-bit signal.

21. The method as recited in claim 20 wherein the applying step for each filter block comprises the steps of:

storing each different set of coefficients in a plurality of coefficient registers;

multiplexing the coefficients in the coefficient registers as a function of the least significant bits of the combination of bits applied to the filter block to produce an interim digital signal;

exclusive ORing the most significant bit of the combination of bits with the interim digital signal; and summing an output from a prior filter block in the row with the output from the exclusive ORing step under control of a carryin signal provided by the most significant bit of the combination of bits, the output of the summing step being applied as an input to a next filter block in the row.

22. The improved method as recited in claim 20 wherein the number of filter blocks in each row equals a maximum filter size divided by a desired decimation rate, and the number of rows equals a maximum decimation rate divided by the number of bits in the combination of bits.

* * * * *